United States Patent
Schnarch

(10) Patent No.: US 6,591,211 B1
(45) Date of Patent: Jul. 8, 2003

(54) TESTING UNIT AND SELF-EVALUATING DEVICE

(75) Inventor: Baruch Schnarch, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/384,473

(22) Filed: Aug. 27, 1999

(51) Int. Cl.[7] .................................................. G06F 11/00
(52) U.S. Cl. ...................... 702/108; 702/118; 702/119; 702/120; 714/100
(58) Field of Search .................... 702/108, 118, 702/119, 120, 122; 714/100, 25, 37, 45, 46; 324/765, 537, 73.1

(56) References Cited

U.S. PATENT DOCUMENTS

| 5,696,772 A | * | 12/1997 | Lesmeister ................... 714/32 |
| 5,875,293 A | * | 2/1999 | Bell et al. ...................... 714/27 |
| 6,028,439 A | * | 2/2000 | Arkin et al. ................. 324/765 |
| 6,066,822 A | * | 5/2000 | Nemoto et al. ............. 209/573 |

* cited by examiner

*Primary Examiner*—Bryan Bui
*Assistant Examiner*—Hien Vo
(74) *Attorney, Agent, or Firm*—Kenyon & Kenyon

(57) ABSTRACT

A testing unit is provided with a test data communication port adapted to output test data to a device being tested. The testing unit also has an expected test result data communication port adapted to output expected test result data to the device. The device being tested generates test result data in response to the test data, and compares the test result data with the expected test result data to generate test status data, such as a pass or fail indication.

30 Claims, 6 Drawing Sheets

TESTING UNIT AND SELF-EVALUATING DEVICE

FIELD

The present invention relates to the testing of devices. More particularly, the present invention relates to the testing of a self-evaluating device.

BACKGROUND

When a device is manufactured, testing may be performed to verify that the device operates properly. For example, a logic device, such as a processor used in a personal computer, may be tested to verify that the logic device properly performs various functions.

FIG. 1 is a block diagram illustrating a known testing unit 100 and a device being tested 150. The testing unit 100 includes a storage unit 110, such as a memory, that stores test data. The test data is sent to the device being tested 150 through a communication port 120. If the device being tested is a processor, the communication port 120 may have a large number of channels, such as several hundred channels, that stimulate the processor by sending test data to the processor's input pins. A large number of sets of test data, such as several million test "vectors," may be sent at a high frequency to thoroughly test the processor's operation.

The device being tested 150 receives the test data and produces test result data. For example, a processor may receive instructions through input pins and generate results that are available through the processor's output pins. The test result data is received by the testing unit 100 through another communication port 130, which may also contain a large number of channels. The testing unit 100 can sample, or "strobe," these channels to capture the test result data.

The testing unit 100 includes a comparing unit 140 that compares the test result data with expected test result data stored in the storage unit 110. Based on the comparison, test status data, such as a "pass" or "fail" indication, is generated by the testing unit 100. For example, a processor may be expected to generate a certain result when provided with a known set of instructions. By comparing the actual result with the expected result, the testing unit 100 can evaluate if the device being tested 150 is functioning properly.

The use of such a testing unit 100, however, has several disadvantages. Unless the number of channels used in the communication port 130 is increased, only a single device 150 can be tested at a given time. For example, if each device being tested has 300 output channels, the communication port 130 would need 900 channels to simultaneously test three devices. That is, the testing unit would receive three sets of test result data, each using 300 channels. Moreover, the testing unit 100 may need additional comparing units to evaluate the test result data from the three devices. These changes would increase the cost of the testing unit 100.

As a result, known testing units 100 evaluate devices one at a time, in series, which increases production testing throughput time and ultimately increases the cost of the device. If multiple devices must be tested in parallel, separate testing units, which can cost millions of dollars each, are required. In addition, using additional testing units may require additional floor space and maintenance, which also increase the cost of the device.

It is also known that a device can incorporate a limited "self-test" or "built-in-test" function. These tests, however, do not use external test data and/or expected test result data, and the coverage of such tests are relatively low. For example, a built-in-test may not be able to generate the millions of test vectors required to completely test the device. In addition, even a limited built-in-test can make the design of the device extremely complex. Moreover, because the built-in-test is designed within a device, it cannot be easily modified.

SUMMARY

In accordance with one embodiment of the present invention, an apparatus for testing a device comprises a test data communication port adapted to output test data to the device. The apparatus also comprises an expected test result data communication port adapted to output expected test result data to the device.

In accordance with another embodiment of the present invention, an apparatus comprises a test data communication port adapted to receive test data from a testing unit. The apparatus also comprises an expected test result data communication port adapted to receive expected test result data from the testing unit.

DETAILED DESCRIPTION

Figure 2:
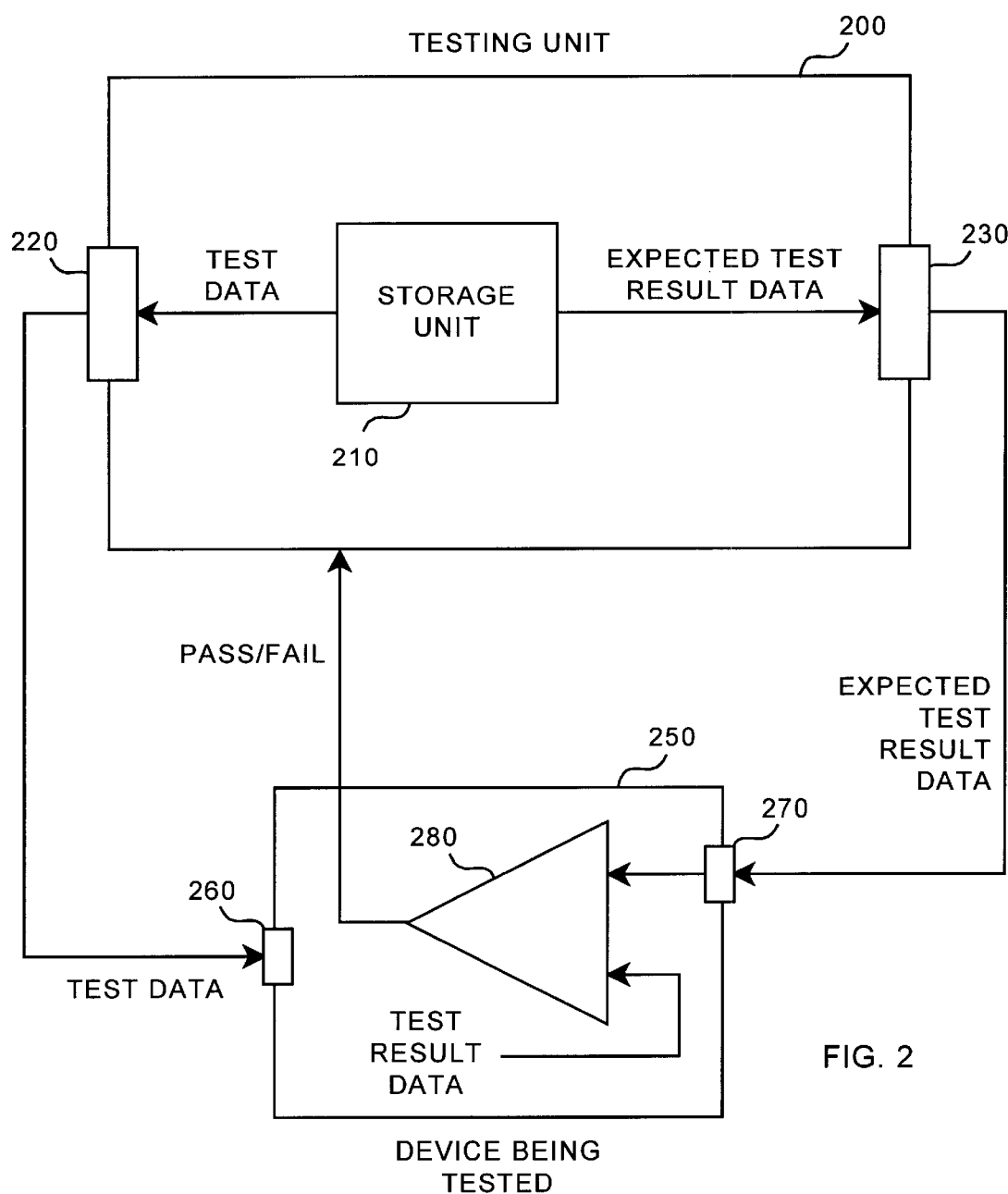
FIG. 2 is a block diagram of a testing unit and a device being tested according to an embodiment of the present invention.

An embodiment of the present invention is directed to the testing of a self-evaluating device. Referring now in detail to the drawings wherein like parts are designated by like reference numerals throughout, FIG. 2 is a block diagram of a testing unit 200 and a device being tested 250 according to an embodiment of the present invention. The testing unit 200 includes a storage unit 210, such as a memory unit, that stores test data. The test data is sent to the device being tested 250 through a communication port 220. If the device being tested is a processor, the communication port 220 uses a plurality of channels to stimulate the processor by sending test data to the processor's input pins. A large number of sets of test data may be sent to the device being tested 250 at a high frequency to thoroughly test the processor's operation.

The device being tested 250 receives the test data and produces test result data. For example, a processor may receive instructions through input pins and generate results that are available through the processor's output pins.

The storage unit 210 also stores expected test result data, which is output from the testing unit 200 through a communication port 230 that may include a plurality of channels. The expected test result data may, of course, be stored in a storage unit different from the storage unit used to store the test data, if required. Also note that both the test data and/or the expected test data may instead be dynamically generated by the testing unit 200 (and not stored), if desired.

The device being tested 250 receives the expected test data through a communication port 270. A comparing unit 280 coupled to the communication port 270 compares the internally generated test result data with the received expected test result data, and generates, based on the comparison, test status data, such as a "pass" or "fail" indication. For example, a processor may be expected to generate a certain result when provided with a known set of instructions. By comparing the actual result produced by the device with the expected result, the device being tested 250 evaluates whether or not it is functioning properly. The result of the evaluation may be reported to the testing unit 200. Such a result may be a simple "pass" or "fail" indication, or may include a more detailed report on the operation of the processor.

The comparing unit 280 may be included in the device being tested 250 as, for example, a Design For Testability (DFT) feature. In the case of a processor, the testing unit 200 drives the test data into the processor as usual, and also drives the expected test result data into the processor during each test cycle. The processor evaluates itself, and reports the result of the evaluation back to the testing unit 200. In this way, all of the data (except the test status data) travels in one direction: from the testing unit 200 to the device being tested 250. With respect to the test status data, the testing unit 200 may sample, for example, a pass/fail pin.

Figure 1:
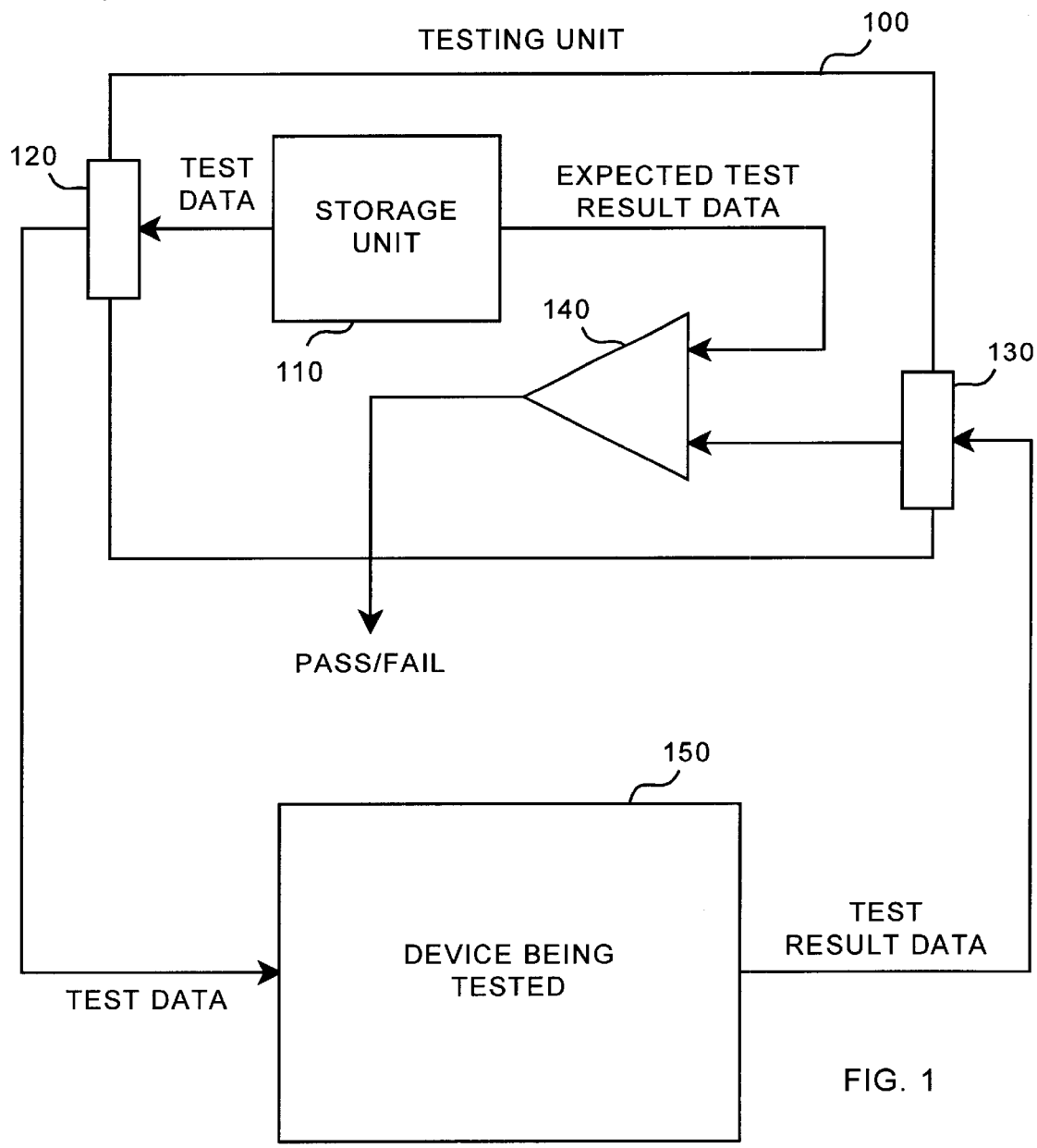
FIG. 1 is a block diagram illustrating a known testing unit and a device being tested.
Figure 3:
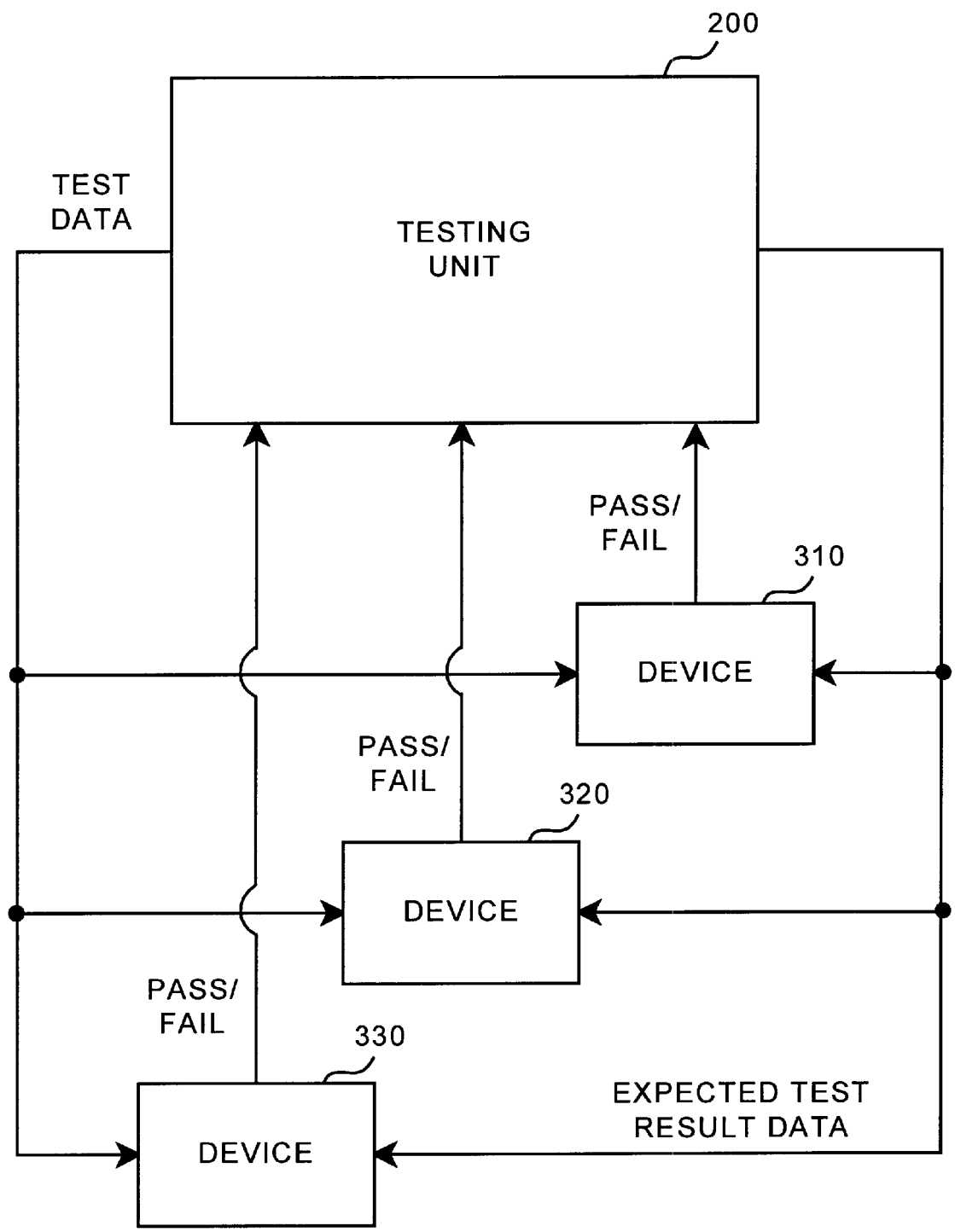
FIG. 3 is a block diagram of a testing unit and a plurality of devices being tested according to an embodiment of the present invention.

Such an arrangement lets the testing unit 200 "broadcast" test data and expected test result data to multiple devices in parallel. FIG. 3 is a block diagram of the testing unit 200 and a plurality of devices being tested 310, 320, 330 according to an embodiment of the present invention. Assume that the expected test result data requires 300 channels. As described with respect to FIG. 1, a traditional testing device would require 900 channels to test three devices in parallel, and each device would send 300 channels worth of test result data to the testing unit 200 to be evaluated. According to an embodiment of the present invention, however, the expected test result data is broadcast to the three devices 310, 320, 330 using only 300 channels, and each device sends a single channel pass/fail indication back to the testing unit 200.

Although FIG. 3 illustrates three device being tested, many more devices may be simultaneously tested in parallel according to embodiments of the present invention. Note that device handling, power, testing board location and other issues may limit the number of devices that can be practically tested in parallel to, for example, four to eight units.

Figure 4:
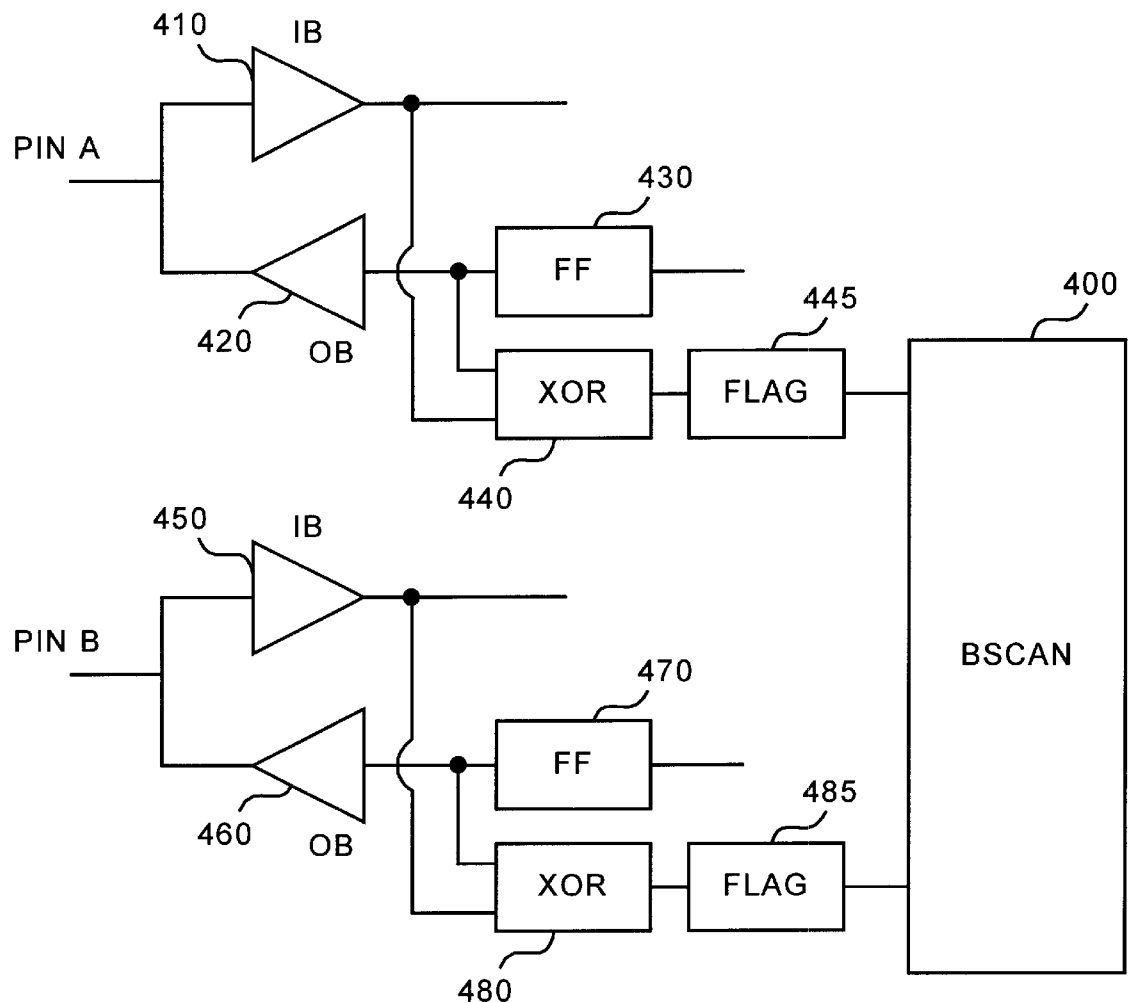
FIG. 4 illustrates IO circuitry for a device being tested according to an embodiment of the present invention.

In the case of a logic device such as a processor, the device being tested may have both input channels, or "pins," and output pins. According to one embodiment of the present invention, the output pins may actually be bidirectional Input Output (IO) pins that can receive the expected test result data. FIG. 4 illustrates IO circuitry for a device being tested according to one embodiment of the present invention. In the testing mode, the device does not drive these outputs as usual, but instead samples the expected test result data provided by the testing unit 200 and compares it with internally generated test result data.

The device includes an IO pin A coupled to an input buffer 410 ("IB") and an output buffer 420 ("OB"). The output buffer 420 contains the information, stored in a flip-flop device 430, that would normally be provided at pin A. When the device has been stimulated with test data, this information represents the test result data.

When in test mode, the input buffer 410 receives the expected test result data from a testing unit. The test result data and the expected test result data are provided to an internal exclusive OR device 440 ("XOR") that functions as a comparing unit. Note that at this time the output buffer 420 is shut off, i.e., the pin is receiving data and not outputting data. The XOR device 440 output is supplied to a sticky flag 445 which is raised when an error is detected, i.e., the test result data does not correspond to the expected test result data. At the end of functional testing, the flag 445 may be sampled serially by the testing unit through a dedicated pin that reflects the pass/fail information, such as through a boundary scan (BSCAN) device 400.

FIG. 4 also illustrates IO pin B, with an input buffer 450, output buffer 460, flip-flop device 470, exclusive OR device 480 and flag device 485 that operate in a similar manner. Although two IO pins are shown in FIG. 4, it will be appreciated that a device being tested may comprise any number of IO pins. Moreover, the arrangement shown in FIG. 4 illustrates only one way to implement the internal comparison, and other specific implementations will also fall within the scope of the present invention.

The operation of the IO circuitry of FIG. 4 will now be described by way of an example. Assume that a processor being tested receives test data from a testing unit, such as through input pins. In response to the test data, the processor produces as test result data a "1" in flip-flop device 430 and a "0" in flip-flop device 470. This data would normally be output through IO pins A and B, respectively.

Because the processor is in test mode, however, pins A and B are used to receive expected test result data, in this case a "1" and a "1," from the testing unit. The XOR device 440 associated with pin A compares the test result data ("1") and the expected test result data ("I") and generates an indication ("0") indicating that the device is functioning as expected with respect to pin A. The XOR device 480 associated with pin B compares the test result data ("0") and the expected test result data ("1")and generates an indication ("1")indicating that the device is not functioning as expected, i.e., has "failed," with respect to pin B.

Figure 5:
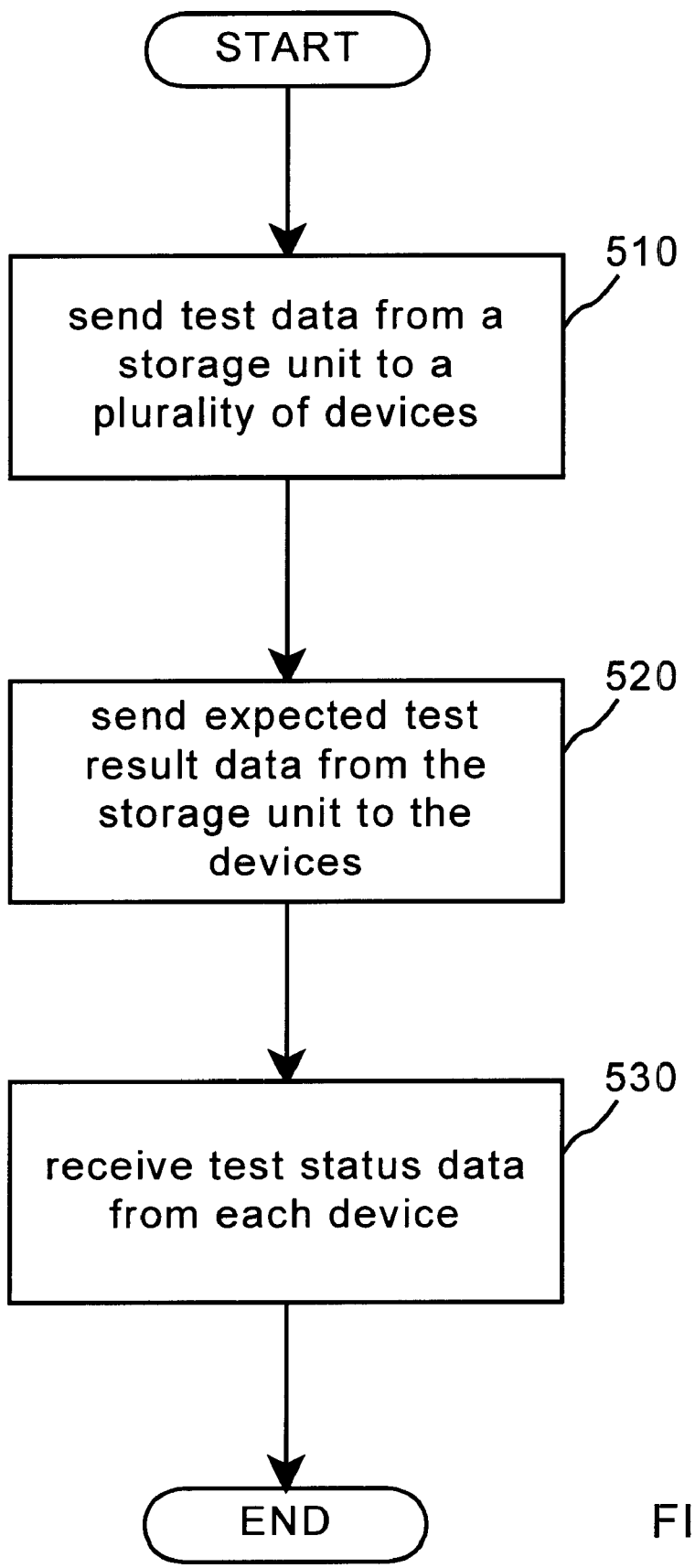
FIG. 5 is a flow diagram of a method for testing a device according to an embodiment of the present invention.

FIG. 5 is a flow diagram of a method for testing a device according to an embodiment of the present invention. Test data is sent from a storage unit to a plurality of devices, in parallel, at 510. Expected test result data is also sent from the storage unit to the devices at 520. The devices may be, for example, logic devices, and the test data and the expected test result data may be sent through a plurality of channels. When testing processors, the test data and expected test data may be sent by broadcasting sequences of data to the processors. After the test data and expected test data are sent to the devices, test status data, such as a pass/fail indication, are received from each device at step 530.

Figure 6:
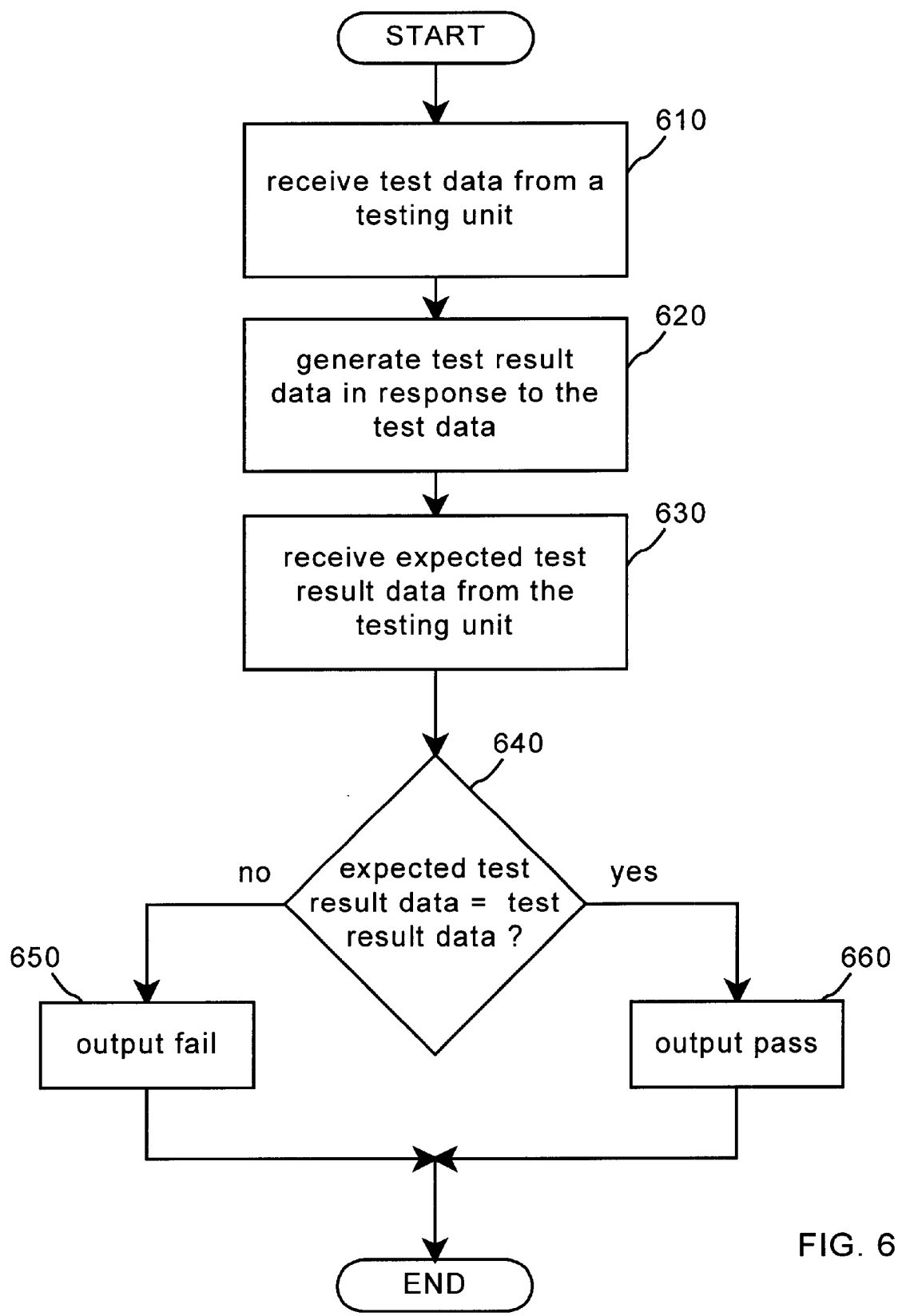
FIG. 6 is a flow diagram of a method for a device being tested according to an embodiment of the present invention.

FIG. 6 is a flow diagram of a method for a device being tested according to an embodiment of the present invention. Test data is received from a testing unit at 610, and test result data is generated at 620 in response to the test data. Expected test result data is also received from the testing unit at 630. The device compares the expected test result data with the test result data at 640. If the expected test result data does not match the test result data, the device outputs a "fail" test status indication at 650. If the expected test result data matches the test result data at 640, the device outputs a "pass" test status indication at 660.

Although various embodiments are specifically illustrated and described herein, it will be appreciated that modifications and variations of the present invention are covered by the above teachings and within the purview of the appended claims without departing from the spirit and intended scope of the invention. For example, although a specific comparing unit devices were used to illustrate embodiments of the present invention, it will be appreciated that other implementations will also fall within the scope of the invention. Moreover, the present invention applies to a broad range of testing architectures, and is therefore a general approach that includes a broad range of specific implementations. In addition, although software or hardware are described to control certain functions, such functions can be performed using either software, hardware or a combination of software and hardware, as is well known in the art. As is also known, software may be stored, such as in memory, in the form of instructions, including micro-code instructions, adapted to be executed by a processor. As used herein, the phrase "adapted to be executed by a processor" encompasses instructions that need to be translated before being executed by the processor.

What is claimed is:

1. An apparatus for testing a device, comprising:
   a test data communication port adapted to output test data to the device; and
   an expected test result data communication port adapted to output expected test result data to the device.

2. The apparatus of claim 1, further comprising:
   a test status data communication port adapted to receive test status data from the device.

3. The apparatus of claim 1, further comprising:
   a storage unit coupled to said test data communication port and adapted to store the test data.

4. The apparatus of claim 1, further comprising:
   a storage unit coupled to said expected test t result data communication port and adapted to store the expected test result data.

5. The apparatus of claim 1, where in said test data communication port is further adapted to output the test data to a plurality of devices in parallel.

6. The apparatus of claim 1, wherein said expected test result data communication port is further adapted to output the expected test result data to a plurality of devices in parallel.

7. The apparatus of claim 1, wherein the device is a logic device, said test data communication port comprises a plurality of channels, and said expected test result data communication port comprises a plurality of channels.

8. The apparatus of claim 7, wherein the logic device is a processor, said test data communication port is adapted to broadcast a sequence of test data to the processor, and said expected test result data communication port is adapted to broadcast a sequence of expected test result data to the processor.

9. A method of testing a device, comprising:
   sending test data to the device; and
   sending expected test result data to the device.

10. The method of claim 9, further comprising:
    receiving test status data from the device.

11. The method of claim 9, wherein said sending the test data further comprises retrieving the test data from a storage unit.

12. The method of claim 9, wherein said sending the expected test result data further comprises retrieving the expected test result data from a storage unit.

13. The method of claim 9, wherein said sending the test data comprises sending the test data to a plurality of devices in parallel.

14. The method of claim 9, wherein said sending the expected test result data comprises sending the expected test result data to a plurality of devices in parallel.

15. The method of claim 9, wherein the device is a logic device, said sending the test data comprises sending the test data through a plurality of channels, and said sending the expected test result data comprises sending the expected test result data through a plurality of channels.

16. The method of claim 15, wherein the logic device is a processor, said sending the test data comprises broadcasting a sequence of test data to the processor, and said sending the expected test result data comprises broadcasting a sequence of expected test result data to the processor.

17. An article of manufacture comprising a computer-readable medium having stored thereon instructions adapted to be executed by a processor, the instructions which, when executed, cause the processor to perform a method of testing a device, said method comprising:
    sending test data to the device; and
    sending expected test result data to the device.

18. An apparatus, comprising:
    a test data communication port adapted to receive test data from a testing unit; and
    an expected test result data communication port adapted to receive expected test result data from the testing unit.

19. The apparatus of claim 18, further comprising:
    a test status data communication port adapted to output test status data.

20. The apparatus of claim 18, further comprising:
    a testing device coupled to said expected test result data communication port.

21. The apparatus of claim 20, wherein said apparatus generates test result data in response to the test data, and said testing device is configured to generated test status data based on the test result data and the expected test result data.

22. The apparatus of claim 21, wherein said testing device is a comparing unit and the test status data is based on a comparison of the test result data and the expected test result data.

23. The apparatus of claim 18, wherein said device is a logic device, said test data communication port comprises a plurality of channels, and said expected test result data communication port comprises a plurality of channels.

24. The apparatus of claim 23, wherein said logic device is a processor, said test data communication port is adapted to receive a sequence of test data from the testing unit, and said expected test result data communication port is adapted to receive a sequence of expected test result data from the testing unit.

25. The apparatus of claim 24, wherein said plurality of channels in said expected test result data communication port comprise a plurality of Input Output (IO) channels, each IO channel comprising an input buffer and an output buffer, an output of said input buffering being coupled to an exclusive-OR device along with an input of said output buffer.

26. A method of testing a device, comprising:
    receiving test data from a testing unit; and
    receiving expected test result data from the testing unit.

27. The method of claim 26, wherein said receiving the test data further comprises generating test result data in response to the test data and further comprising:
    comparing the expected test result data with the test result data; and
    outputting test status data.

28. The method of claim 26, wherein the device is a logic device, said receiving the test data comprises receiving the test data through a plurality of channels, and said receiving the expected test result data comprises receiving the expected test result data through a plurality of channels.

29. The method of claim 28, wherein the logic device is a processor, said receiving the test data comprises receiving a sequence of test data from the testing unit, and said receiving the expected test result data comprises receiving a sequence of expected test result data from the testing unit.

30. An article of manufacture comprising a computer-readable medium having stored thereon instructions adapted to be executed by a processor, the instructions which, when executed, cause the processor to perform a method of testing a device, said method comprising:
    receiving test data from a testing unit; and
    receiving expected test result data from the testing unit.

* * * * *